United States Patent [19]

Bögl

[11] Patent Number: 5,053,728
[45] Date of Patent: Oct. 1, 1991

[54] PHASE LOCKED LOOP FREQUENCY MODULATOR USING DATA MODULATED DIGITAL SYNTHESIZER AS REFERENCE

[75] Inventor: Thomas Bögl, Königsbrunn, Fed. Rep. of Germany

[73] Assignee: Rohde & Schwarz GmbH & Co., KG, Fed. Rep. of Germany

[21] Appl. No.: 604,253

[22] Filed: Oct. 29, 1990

[30] Foreign Application Priority Data

Nov. 28, 1989 [DE] Fed. Rep. of Germany ....... 3939259

[51] Int. Cl.$^5$ .......................... H04L 27/12; H03L 7/06
[52] U.S. Cl. ..................................... 332/100; 332/127; 375/51; 375/65
[58] Field of Search ............... 332/100, 101, 102, 127, 332/128; 375/45, 51, 62, 65

[56] References Cited

U.S. PATENT DOCUMENTS 3,735,269 5/1973 Jackson ................................. 328/14
4,628,286 12/1986 Nossen ................................. 332/100

Primary Examiner—Siegfried H. Grimm
Attorney, Agent, or Firm—Hill, Van Santen, Steadman & Simpson

[57] ABSTRACT

In a frequency-modulated frequency generator comprising an oscillator connected in a phase control loop, the reference frequency is generated in a digital frequency synthesizer which is adapted to be frequency-modulated by digital data signals; under control of the data signal, numerical values are alternately read out from a register to result in corresponding different frequency deviations; the register stores further predetermined additional numerical values which result in frequencies adjacent to said frequency deviations; the register is controlled by the data signal so that for every edge of the data signal predetermined additional numerical values are initially read out in such an order that the frequency values produced thereby will compensate for any overshooting which occurs upon switching between the drift frequencies.

2 Claims, 2 Drawing Sheets

PHASE LOCKED LOOP FREQUENCY MODULATOR USING DATA MODULATED DIGITAL SYNTHESIZER AS REFERENCE

BACKGROUND OF THE INVENTION

1. Field of the Invention

The present invention relates to a frequency-modulated reference frequency generator with overshoot compensation in switching between two frequencies about a predetermined reference frequency.

2. Description of the Prior Art

Phase-controlled oscillators (PLL-oscillators) can be frequency-modulated either by corresponding action on the phase-locked loop or by corresponding frequency modulation of the reference frequency applied to the phase detector. In the latter case of frequency modulation more or less intense distortions of the data signals may occur due to overshooting and transients during the frequency change. This occurs to a significant degree in PLL-synthesizers in which the parameters for the phase-locked loop must be dimensioned for optimum fast locking such as is required, for instance, for controlling communication transmitters operating on the principle of frequency hopping. Moreover, because of the interfering overshooting the modulation spectrum is unnecessarily broadened, and a strong hangover may occur in the intermediate-frequency filter of a receiver which receives the modulated signal, whereby also the detectability is deteriorated and consequently the bit error ratio is increased. To avoid this drawback it has been necessary with known synthesizers of this kind either to change the loop parameters or to reduce the data rate, which means that previously such distortions could be prevented only at the cost of a deterioration in the synthesizer performance.

Purely digital synthesizers are also known in which the output signal is generated by direct digital synthesis (Neues von Rohde & Schwarz, No. 123, fall of 1988, p. 16, U.S. Pat. No. 3,735,269, fully incorporated herein by reference DE-PS 3,740,130). Such digital synthesizers may also be frequency-modulated in a simple way by a digital data signal (square-wave pulses), and to this end it is only required to allocate to the control input of the synthesizer a corresponding register in which the two drift frequencies, which are adjacent a centre frequency and determine the frequency deviation, are stored as numerical values which are alternately read out for modulation in response to the data signal. Such purely digital synthesizers, however, have the drawback of a low degree of freedom from spurious frequencies.

SUMMARY OF THE INVENTION

It is the object of the present invention to provide a frequency generator adapted to be frequency-modulated by digital signals, in which any data distortions due to overshooting are prevented irrespective of the dimensioning of the control parameters and the data rate.

In the digital synthesizer of the frequency-modulated frequency generator according to the present invention, there is no abrupt switching in response to the edges of the data signal between the numerical values resulting in the two drift frequencies, but switching is instead performed stepwise in accordance with a predetermined frequency function with a plurality of different frequency values. These frequency values and their order depend on the expected transients, and these values may either be calculated or determined empirically. The choice of these transient frequency values at the commencement of each data signal edge is completely free, it is possible to determine the respective exactly matching compensating frequency transition for any optional phase-locked loops with varying transient response depending on the respective dimensioning thereof. By appropriate selection of these transition frequencies it is possible, on the one hand, to achieve a desired fast modulation increase while at the same time an aperiodic transient oscillation is achieved. The present invention is applicable to all kinds of PLL-frequency synthesizers in which the mentioned overshooting occurs upon modulation.

BRIEF DESCRIPTION OF THE DRAWINGS

Other objects, features and advantages of the invention, its organization, construction and operation will best be understood from the following detailed description taken in conjunction with the accompanying drawings in which.

DESCRIPTION OF THE PREFERRED EMBODIMENTS

Figure 1:
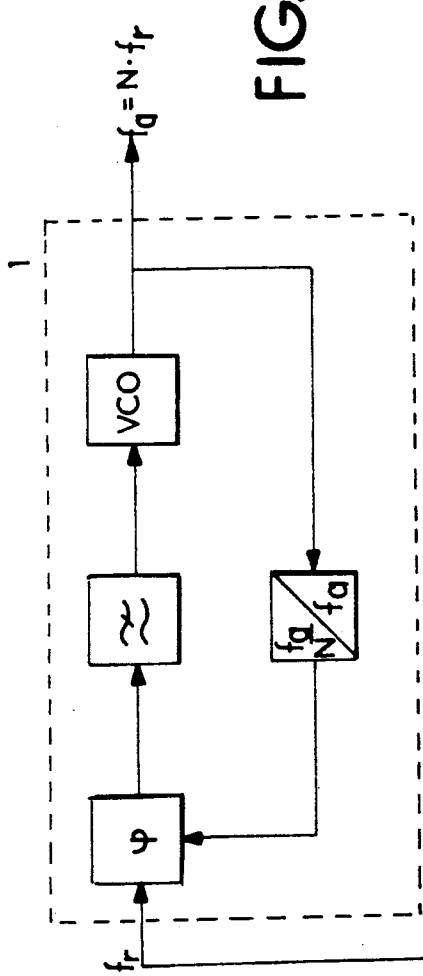
FIG. 1 is a block diagram of a frequency modulator according to the invention.
Figure 1:
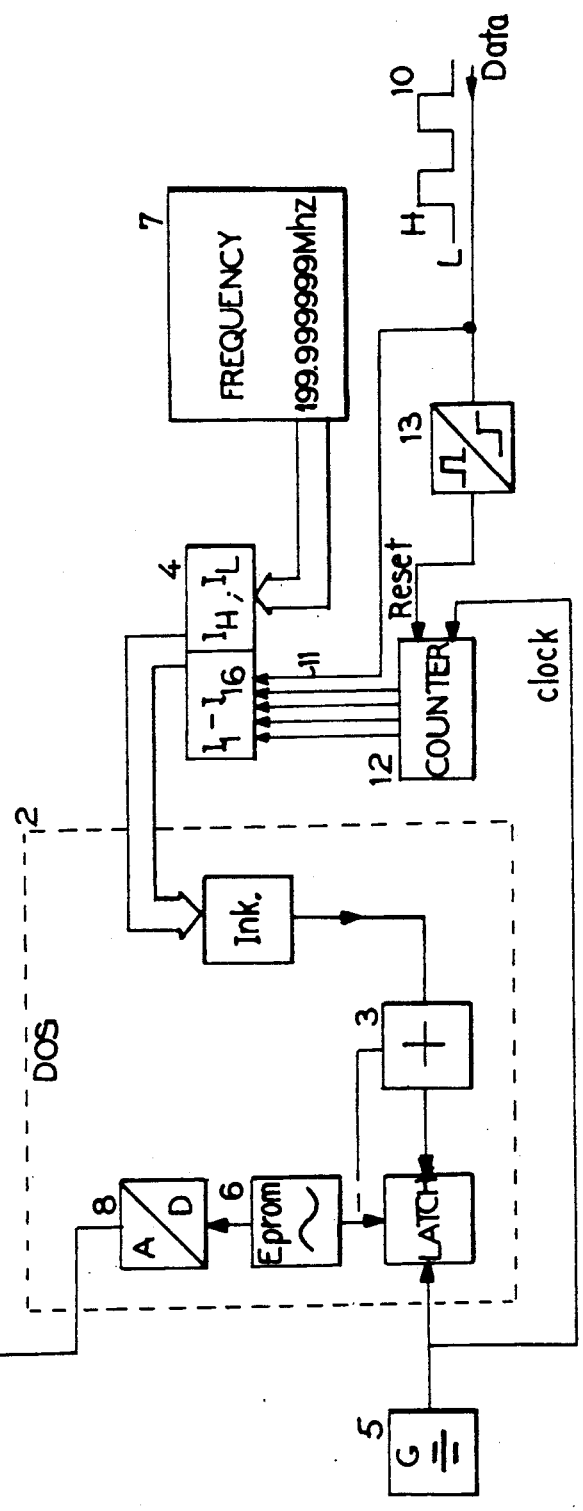

FIG. 1 is the basic circuit diagram of a standard frequency generator including a phase-controlled ocsillator 1 of known design the reference frequency $f_r$ of which is generated by a known digital synthesizer 2. This digital synthesizer comprises an adder 3 in which numerical increments supplied to the adder from an increment register 4 are continually added up. The adder 3 is applied with a fixed clock frequency from a clock generator 5. The output of the adder 3 is coupled to a memory 6 in which the interpolation nodes of a full sine-wave period are stored. During one adding cycle of the adder one full sine-wave period is read out incrementally from this memory 6. The read digital values are converted in a digital-to-analog converter 8 to an analog sine-wave signal which is then supplied as the reference frequency to the phase comparator of the phase-controlled oscillator 1. The frequency of the said sine-wave period is determined by the value of the added increment, and for frequency setting a setting means 7 cooperates with the increment register 4, the desired output frequency being settable in said setting means.

For frequency modulation of this digital synthesizer 2 with a square-wave data signal 10 switchable between 0 and 1 the increment register 4 is provided with an additional control input 11 so that in response to the data signal 10 two relatively adjacent numerical increments can alternately be read out which then result in two different drift frequencies. When the H-level of the data signal 10 is applied to the input 11 an increment $I_H$ is read out from the increment register 4 and thereby the frequency $f_H$ is generated at the output of the synthesizer 2. When the L-level of the data signal 10 is applied to the input 11 an increment $I_L$ is read out and thereby the output frequency $f_L$ is generated.

Figure 2:
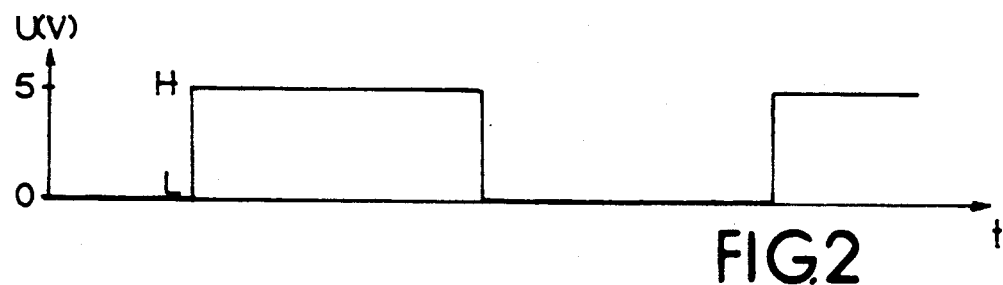
FIGS. 2-5 are graphs showing waveforms used in explaining the operation of the frequency modulator of FIG. 1.
Figure 3:
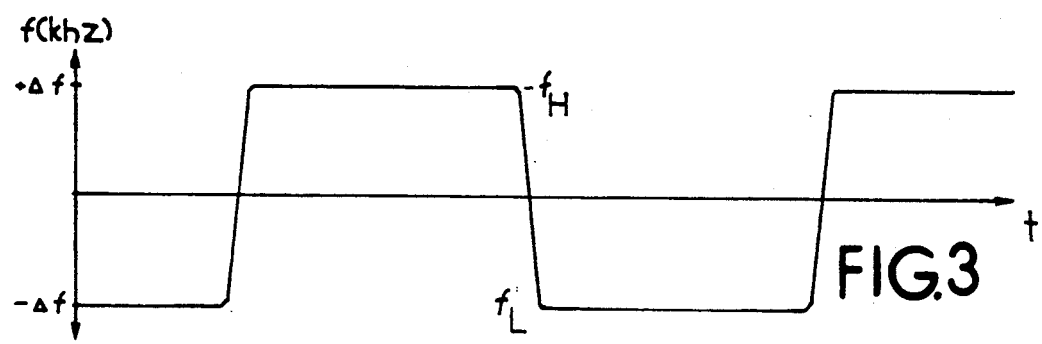

The FIGS. 2 and 3 schematically illustrate this relationship.

Figure 4:
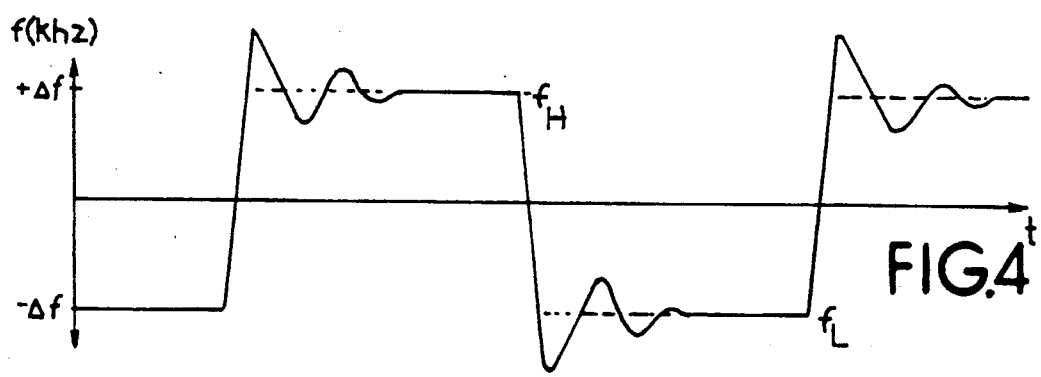

However, depending on the dimensioning of the phase-locked loop 1 it is not the ideal frequency response of FIG. 3 which is obtained but a frequency response of the output frequency $f_a$ more or less distorted due to overshooting, as will be apparent from FIG. 4. Both with the rising and the falling data edge a more or less intense overshooting occurs initially until, following a transient oscillation, the desired drift frequency value $f_H$ or $f_L$ is reached.

To compensate for this overshooting the increment register 4 has stored therein not only the increments $I_H$ and $I_L$ but also a number of additional increments which are read out as intermediate values for each drift frequency change in a predetermined order. To this end an additional counter 12 is provided which is controlled in response to the data signal 10 via an edge detector 13 and through which selected addresses can be read out from the increment register.

Figure 5:
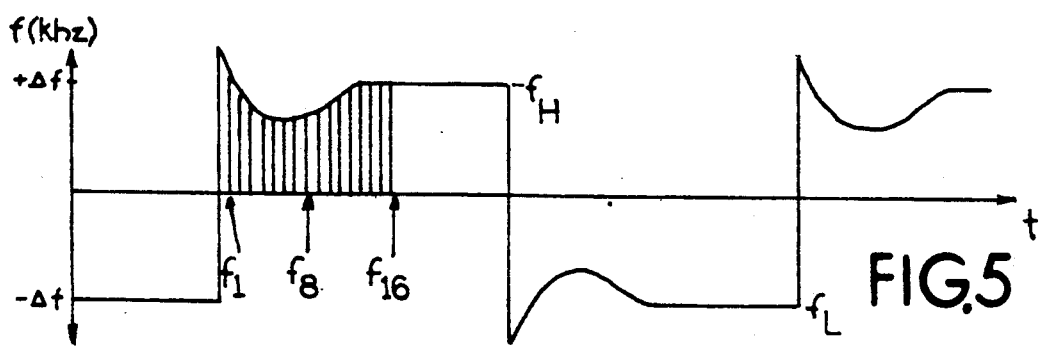

In the illustrated embodiment a 4-bit-counter 12 is provided through which sixteen addresses in the increment register 4 can therefore be read out. Predetermined numerical increments, which according to FIG. 5 each result in selected frequency values f1 to f16, are stored at these sixteen addresses of the increment register 4. For every rising or falling edge of the data signal 10 the counter 12 is reset as controlled by the edge detector 13 and then commences up-counting at the clock frequency. When the counter has reached its maximum count it is stopped, i.e. at the count of 15 in the 4-bit-counter of the embodiment. During counting the incremental values corresponding to the mentioned frequency values f1 to f16 and stored at the respective addresses are successively read out from the increment register 4. In the embodiment of FIG. 5, therefore, commencing with the rising edge the frequency value f1 is read out from the first address of the increment register 4, this frequency value f1 in the illustrated embodiment being larger than the actual drift frequency value $f_H$. Thereby a desired fast modulation increase time is achieved, for example. Thereafter, successively decreasing frequency values f2 to f8 are read out and thereafter, for example, increasing frequency values f8 to f15 until finally the counter stops when it has reached its maximum count and the last frequency value f16 remains static, which of course corresponds to the desired drift frequency value $f_H$ (or $f_L$) at the falling edge. At the next-following edge this process is repeated Size and order of the individual frequency values f1 to f16 depend on the kind and quantity of frequency overshooting in the synthesizer control loop as schematically indicated in FIG. 4). FIG. 5 shows that the characteristic of the transition frequencies f1 to f16 following every edge approximately corresponds to the frequency characteristic of an overshoot spike of FIG. 4, although this does not necessarily follow. The frequency characteristic according to FIG. 5 is appropriately determined by trial and error until finally an output signal is obtained which is completely free from overshooting and corresponds more or less ideally to the characteristic of FIG. 5.

The principle of the present invention, according to which distortions occurring in a control loop of a system driven through a digital synthesizer are prevented by previously correspondingly pre-distorting the data signal which is susceptible to distortions, is not only suited for the corresponding presetting of frequency values but analogously also for systems in which, due to the amplitude of a digitally produced signal, corresponding distortions occur in an amplitude control loop. In the latter case and analogously with FIG. 5, the data signal supplied to the amplitude control system is correspondingly preset as to amplitude, whereby the amplitude distortions caused in the system are balanced.

Although I have described my invention by reference to particular illustrative embodiments thereof, many changes and modifications of the invention may become apparent to those skilled in the art without departing from the spirit and scope thereof. I therefore intend to include within the patent warranted hereon all such changes and modifications as may reasonably and properly be included within the scope of my contribution to the art.

I claim:

1. In a frequency-modulated frequency generator of the type in which a phase-controlled oscillator is operated in response to an input frequency signal to alternately produce first and second frequency signals respectively above and below a reference frequency, a digital synthesizer including a memory storing interpolation nodes of a full sine wave period, cyclically operating adder means connected to the memory for incrementally reading a full sine wave period from the memory during one adding cycle, and a digital-to-analog converter connected to the memory for producing the reference frequency signal, the improvement therein comprising:

modulating means connected to the adder means for modulating the operation of the digital synthesizer in response to an input data signal having first and second levels respectively representing the first and second frequency signals, said modulating means including an increment register storing first data representing the first frequency, second data representing the second frequency and increment data representing individual frequencies adjacent the first and second frequencies;

frequency setting means connected to said increment register for reading the first and second data into the adder means to set the frequency of the input frequency signal; and overshoot correction means connected to receive said input frequency signal and connected to said register means and operable in response to each half cycle of the input data signal to read the increment data into said adder means as overshoot correction data ending with the respective first and second data.

2. The improved frequency-modulated frequency generator of claim 1, wherein said overshoot correction means comprises:

a resettable clocked counter connected to said increment register for reading the increment data into the adder means as overshoot correction data; and reset means including an input for receiving the input data signal and an output connected to said counter and operable in response to a signal edge between the first and second levels of said input data signal to reset said counter.

* * * * *